United States Patent
Strock

(10) Patent No.: US 10,151,245 B2
(45) Date of Patent: Dec. 11, 2018

(54) FIXTURING FOR THERMAL SPRAY COATING OF GAS TURBINE COMPONENTS

(71) Applicant: United Technologies Corporation, Hartford, CT (US)

(72) Inventor: Christopher W. Strock, Kennebunk, ME (US)

(73) Assignee: United Technologies Corporation, Farmington, CT (US)

( * ) Notice: Subject to any disclaimer, the term of this patent is extended or adjusted under 35 U.S.C. 154(b) by 67 days.

(21) Appl. No.: 14/772,180

(22) PCT Filed: Mar. 6, 2014

(86) PCT No.: PCT/US2014/021250
§ 371 (c)(1),
(2) Date: Sep. 2, 2015

(87) PCT Pub. No.: WO2014/138416
PCT Pub. Date: Sep. 12, 2014

(65) Prior Publication Data
US 2016/0010197 A1    Jan. 14, 2016

Related U.S. Application Data

(60) Provisional application No. 61/773,517, filed on Mar. 6, 2013.

(51) Int. Cl.
*C23C 4/00* (2016.01)
*C23C 14/04* (2006.01)
*B05B 15/04* (2006.01)
*B05C 21/00* (2006.01)
*F02C 7/20* (2006.01)
(Continued)

(52) U.S. Cl.
CPC ............... *F02C 7/20* (2013.01); *B05B 12/20* (2018.02); *B05C 21/005* (2013.01); *C23C 4/01* (2016.01); *C23C 4/02* (2013.01); *C23C 4/11* (2016.01); *C23C 14/042* (2013.01); *C23C 28/3215* (2013.01); *C23C 28/3455* (2013.01); *F01D 25/285* (2013.01); *B05B 13/0285* (2013.01); *B05C 13/02* (2013.01); *F05D 2230/30* (2013.01); *F05D 2230/31* (2013.01); *F05D 2230/311* (2013.01); *F05D 2230/312* (2013.01); *F05D 2230/90* (2013.01); *F05D 2240/35* (2013.01); *F05D 2240/90* (2013.01)

(58) Field of Classification Search
None
See application file for complete search history.

(56) References Cited

U.S. PATENT DOCUMENTS 4,284,658 A    8/1981  Davis et al.
4,530,861 A *  7/1985  Sippel ................... B05B 15/045
                                                        118/503
(Continued)

*Primary Examiner* — Binu Thomas
(74) *Attorney, Agent, or Firm* — O'Shea Getz P.C.

(57) ABSTRACT

A fixture assembly includes a standoff, a backplate and a spray coating shield attached to a support. The assembly supports a workpiece and sprays a base coat at substantially ninety degrees with respect to a surface of the workpiece to coat the workpiece with the base coat. The assembly sprays a top coat at an angle with respect to the surface of the workpiece to mask a shadowed surface area of the workpiece, where the angle different from ninety degrees.

16 Claims, 15 Drawing Sheets

(51) Int. Cl.
  *B05B 12/20*    (2018.01)
  *F01D 25/28*    (2006.01)
  *C23C 4/02*     (2006.01)
  *C23C 28/00*    (2006.01)
  *C23C 4/11*     (2016.01)
  *C23C 4/01*     (2016.01)
  *B05B 13/02*    (2006.01)
  *B05C 13/02*    (2006.01)

(56) References Cited

U.S. PATENT DOCUMENTS

| | | | |
|---|---|---|---|
| 5,323,601 A | 6/1994 | Jarrell et al. | |
| 5,460,206 A | 10/1995 | Sansoucy | |
| 5,565,035 A * | 10/1996 | Sylvestro | C23C 14/042 |
| | | | 118/504 |
| 5,697,213 A | 12/1997 | Brewer et al. | |
| 5,792,267 A | 8/1998 | Marszal et al. | |
| 5,879,753 A | 3/1999 | Zajchowski et al. | |
| 5,916,638 A | 6/1999 | Zajchowski et al. | |
| 6,224,673 B1 | 5/2001 | Das et al. | |
| 6,252,406 B1 | 6/2001 | Tegge et al. | |
| 6,296,705 B1 | 10/2001 | Ireland et al. | |
| 6,401,447 B1 | 6/2002 | Rice et al. | |
| 6,403,157 B2 | 6/2002 | Ireland et al. | |
| 6,579,567 B1 | 6/2003 | Das et al. | |
| 6,821,564 B2 | 11/2004 | Das et al. | |
| 6,887,529 B2 * | 5/2005 | Borneman | C23C 4/02 |
| | | | 118/503 |
| 6,974,503 B2 | 12/2005 | Byrnes et al. | |
| 7,093,439 B2 | 8/2006 | Pacheco-Tougas et al. | |
| 7,546,684 B2 | 6/2009 | Caldwell et al. | |
| 7,837,843 B2 | 11/2010 | Sharp et al. | |
| 7,914,251 B2 | 3/2011 | Pool et al. | |
| 8,216,687 B2 | 7/2012 | Burd et al. | |
| 8,256,223 B2 | 9/2012 | Dierberger et al. | |
| 8,308,916 B2 | 11/2012 | Sharp et al. | |
| 8,349,086 B2 | 1/2013 | Bernaski et al. | |
| 8,353,259 B2 | 1/2013 | Stock et al. | |
| 2003/0014888 A1 * | 1/2003 | Hertz | G09F 1/10 |
| | | | 40/124 |
| 2009/0324852 A1 * | 12/2009 | Schlichting | C23C 14/042 |
| | | | 118/720 |
| 2010/0263386 A1 | 10/2010 | Edwards et al. | |
| 2012/0132138 A1 * | 5/2012 | Beaudoin | B05B 15/0431 |
| | | | 118/504 |
| 2014/0173896 A1 * | 6/2014 | Tryon | B05C 13/02 |
| | | | 118/500 |

\* cited by examiner

FIXTURING FOR THERMAL SPRAY COATING OF GAS TURBINE COMPONENTS

This application claims priority to PCT Patent Application No. PCT/US14/21250 filed Mar. 6, 2014, which claims priority to U.S. Patent Appln. No. 61/773,517 filed Mar. 6, 2013.

BACKGROUND

The present disclosure relates to a gas turbine engine and, more particularly, to fixturing of workpieces such as combustor liner panels therefor.

Gas turbine engines, such as those that power modern commercial and military aircraft, generally include a compressor section to pressurize an airflow, a combustor section to burn a hydrocarbon fuel in the presence of the pressurized air, and a turbine section to extract energy from the resultant combustion gases.

The combustor section includes a combustor assembly that typically includes a dome assembly that establishes a bluff body to stabilize the flame and a combustor liner assembly attached downstream of the dome assembly. The combustor liner assembly is typically fabricated from individual liner panels welded or bolted together. The combustor liner panels form a substantially closed duct, typically annular, that channels the hot gases of combustion to the turbine section.

The combustor liner assembly is subject to high thermal loads for prolonged periods of time. To survive these conditions, the combustor liner panels are cooled and include various thermal barrier coatings. In one cooling arrangement, a twin wall configuration includes a shell lined with the liner panels attached thereto with studs and nuts. In addition to dilution holes, relatively smaller air impingement holes direct cooling air between the outer shell and the liner panels to cool the backside of the liner panels. This cooling air then exits effusion holes in the liner panels to form a cooling film on the hot side inner surface of the liner panels.

The combustor liner panels are manufactured of high temperature alloys and the hot side inner surface thereof are coated with a thermal barrier coating system. The thermal barrier coating system typically includes a metallic bond coat and a ceramic top coat to insulate the hot side inner surface from hot combustion gases and the associated radiated heat.

The thermal barrier coatings are applied to the liner panels via a spray operation with the liner panels fixtured as mounted in the engine. For one example combustor assembly, ten (10) liner panels are arranged in a circular pattern with about a twenty-five (25) inch diameter with about a two (2) inch axial length. The fixture and parts rotate about a central axis on a turntable while a spray torch traverses back and fourth axially to apply the coating. In order to apply a uniform thermal barrier coating thickness over the hot side inner surface, the spray torch over travels the liner panel edge. Typically, ten (10) parts are coated at a time and about 50% of the spray time is spent in over travel beyond the liner panel edge which wastes significant time and spray coating material.

SUMMARY

A holder assembly according to one disclosed non-limiting embodiment of the present disclosure includes a backplate and spray coating shield positioned relative to a standoff.

A further embodiment of the present disclosure includes, wherein the backplate includes a multiple of apertures.

A further embodiment of any of the foregoing embodiments of the present disclosure includes wherein the backplate includes a multiple of apertures that correspond with apertures through a workpiece.

A further embodiment of any of the foregoing embodiments of the present disclosure includes, wherein the backplate includes a multiple of apertures that correspond with studs that extend from a workpiece.

A further embodiment of any of the foregoing embodiments of the present disclosure includes, wherein the spray coating shield is generally parallel to the backplate.

A further embodiment of any of the foregoing embodiments of the present disclosure includes, wherein the spray coating shield is spaced a predetermined distance from a workpiece to mask an shadowed surface area of the workpiece with a shadow therefrom.

A further embodiment of any of the foregoing embodiments of the present disclosure includes, wherein the spray coating shield is wedge shaped.

A further embodiment of any of the foregoing embodiments of the present disclosure includes, wherein the spray coating shield is spaced a predetermined distance from a workpiece to mask an shadowed surface area of the workpiece with a shadow therefrom.

A further embodiment of any of the foregoing embodiments of the present disclosure includes, wherein the spray coating shield is arranged radially and axially relative to the base plate.

A further embodiment of any of the foregoing embodiments of the present disclosure includes, wherein the spray coating shield is arranged radially and axially relative to the backplate.

A further embodiment of any of the foregoing embodiments of the present disclosure includes, wherein the spray coating shield is removable.

A further embodiment of any of the foregoing embodiments of the present disclosure includes a support, the standoff supported by the support.

A further embodiment of any of the foregoing embodiments of the present disclosure includes, wherein the standoff is a fixed ring mounted to a baseplate.

A method of spraying a multiple of liner panels of a gas turbine engine according to another disclosed non-limiting embodiment of the present disclosure includes mounting a multiple of holder assemblies to respectively support a multiple of liner panels not oriented as in the gas turbine engine.

A further embodiment of any of the foregoing embodiments of the present disclosure includes rotating the multiple of holder assemblies about an axis while spraying the multiple of liner panels with a thermal barrier coating.

A further embodiment of any of the foregoing embodiments of the present disclosure includes shadow masking the multiple of liner panels with a spray coating shield that extends from each of the multiple of holder assemblies.

A further embodiment of any of the foregoing embodiments of the present disclosure includes spraying the multiple of liner panels with a bond coat of a thermal barrier coating at an angle with respect to the liner panel to coat each liner panel.

A further embodiment of any of the foregoing embodiments of the present disclosure includes spraying the bond coat of the multiple of liner panels with a top coat of the thermal barrier coating at an angle with respect to the liner panel to shadow mask an shadowed surface area of each liner panel with a spray coating shield.

A further embodiment of any of the foregoing embodiments of the present disclosure includes spraying the multiple of liner panels with a bond coat of a thermal barrier coating to coat each liner panel.

A further embodiment of any of the foregoing embodiments of the present disclosure includes installing a spray coating shield with respect to each of the multiple of liner panels; and spraying the bond coat of the multiple of liner panels with a top coat of the thermal barrier coating at an angle with respect to the liner panel to shadow mask an shadowed surface area of each liner panel with a spray coating shield.

The foregoing features and elements may be combined in various combinations without exclusivity, unless expressly indicated otherwise. These features and elements as well as the operation of the invention will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
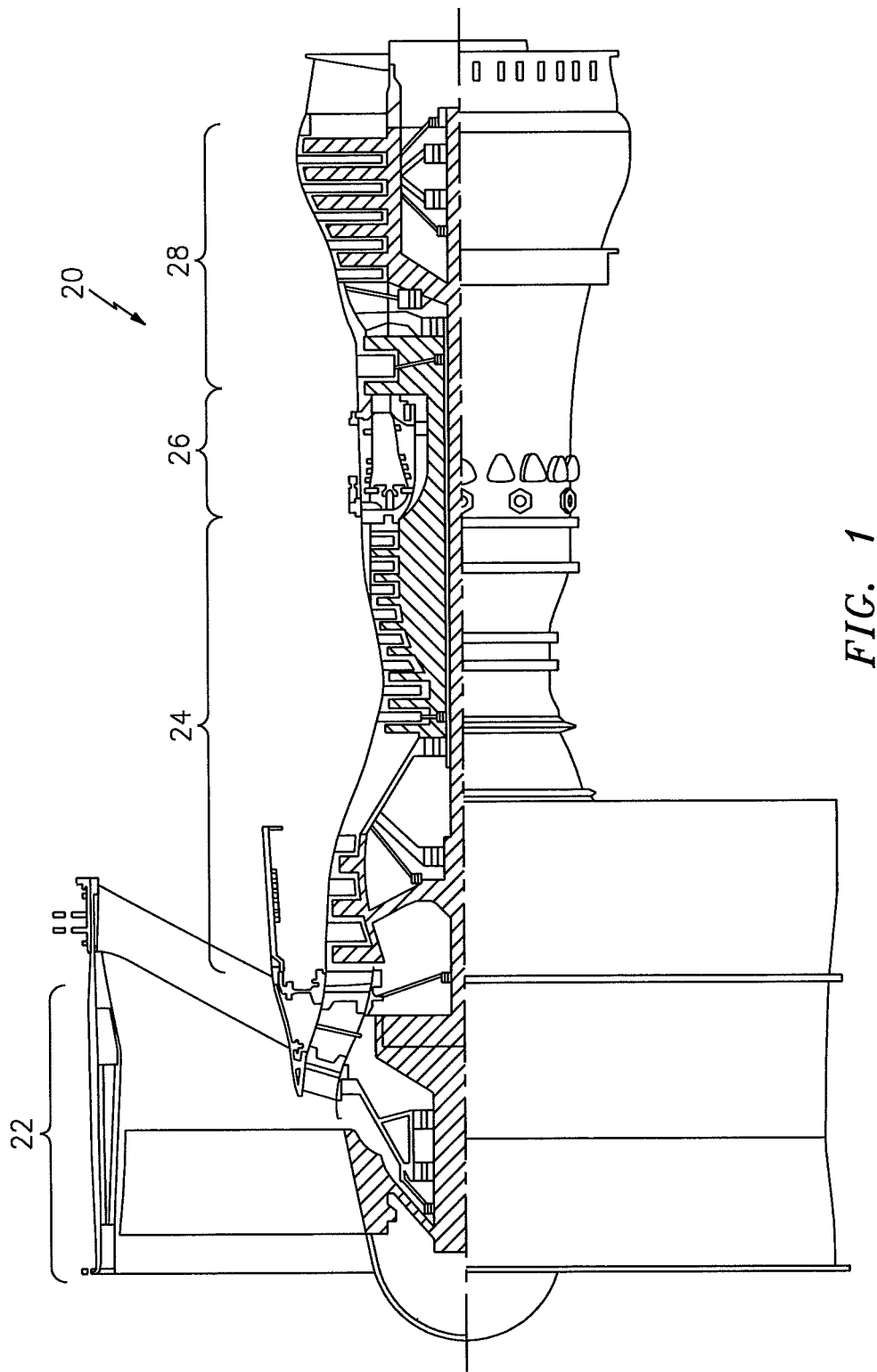
FIG. 1 is a schematic cross-section of an example gas turbine engine.
Figure 2:
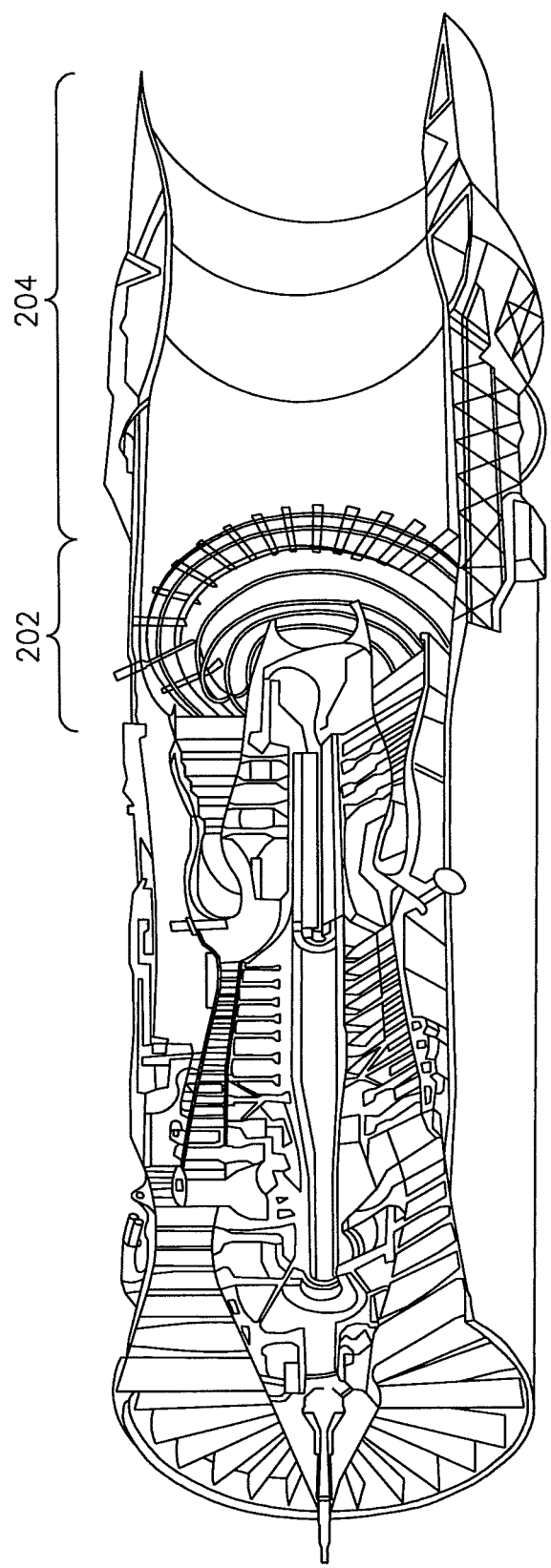
FIG. 2 is a schematic cross-section of another example gas turbine engine.

FIG. 1 schematically illustrates a gas turbine engine 20. The gas turbine engine 20 is disclosed herein as a two-spool turbo fan that generally incorporates a fan section 22, a compressor section 24, a combustor section 26 and a turbine section 28. Alternative engine architectures 200 might include an augmentor section 202 and exhaust duct section 204 (FIG. 2) among other systems or features. The fan section 22 drives air along a bypass flowpath while the compressor section 24 drives air along a core flowpath for compression and communication into the combustor section 26 then expansion through the turbine section 28. Although depicted as a geared turbofan in the disclosed non-limiting embodiment, it should be understood that the concepts described herein are not limited to use with turbofans as the teachings may be applied to other types of turbine engines such as a low bypass augmented turbofan (FIG. 2), turbojets, turboshafts, and three-spool (plus fan) turbofans wherein an intermediate spool includes an intermediate pressure compressor ("IPC") between a Low Pressure Compressor ("LPC") and a High Pressure Compressor ("HPC"), and an intermediate pressure turbine ("IPT") between the high pressure turbine ("HPT") and the Low pressure Turbine ("LPT").

Figure 3:
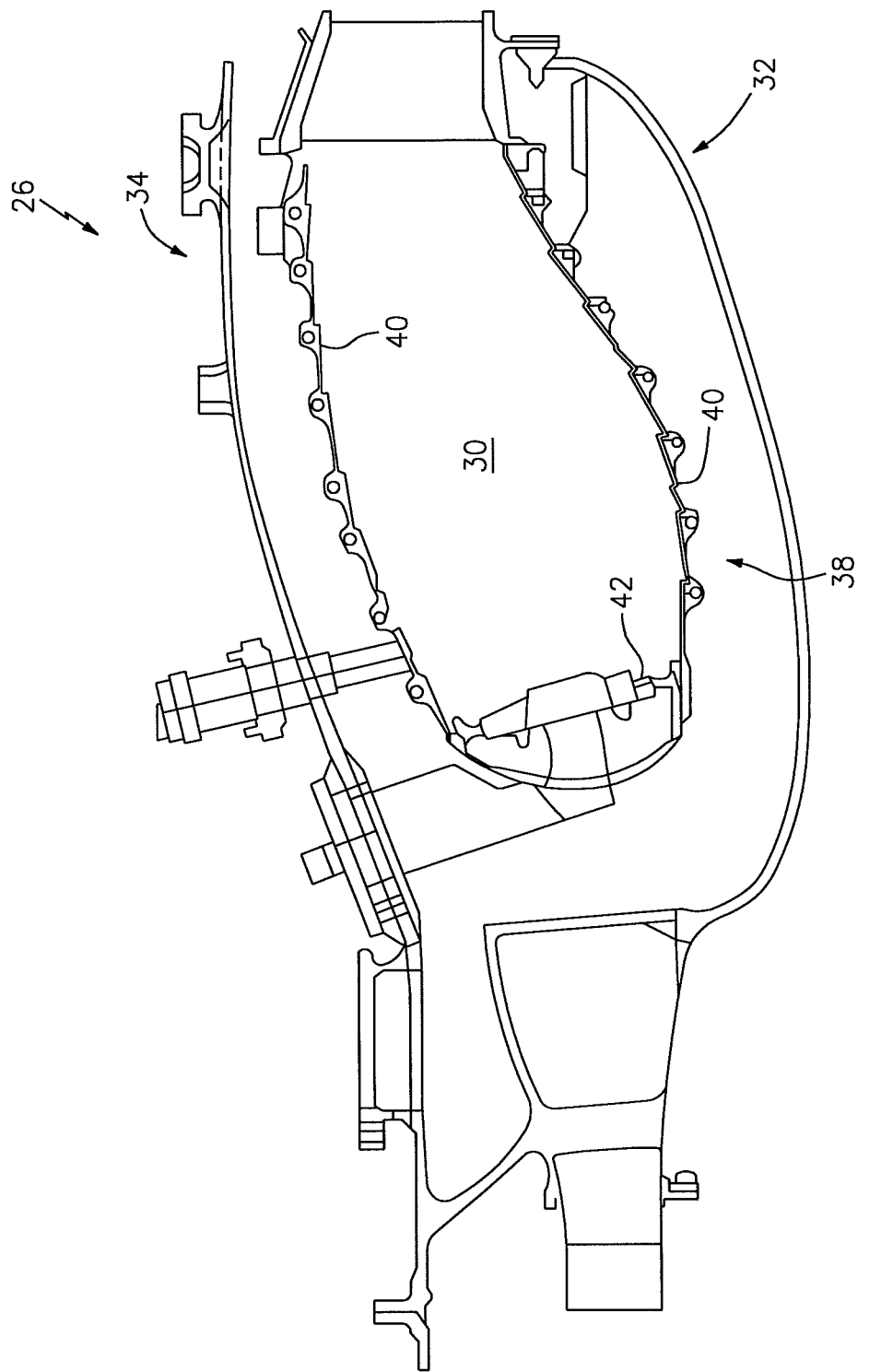
FIG. 3 is a schematic sectional view of a combustor.

With reference to FIG. 3, the combustor section 26 includes a combustion chamber 30 that includes an inner diffuser case 32 and an outer diffuser case 34. A liner assembly 38 includes a dome assembly 36 and a plurality of liner panels 40 that are staggered or otherwise arranged downstream of bulkhead liner panels 42 arranged transverse to the liner panels 40 (also shown in FIG. 4).

Figure 5:
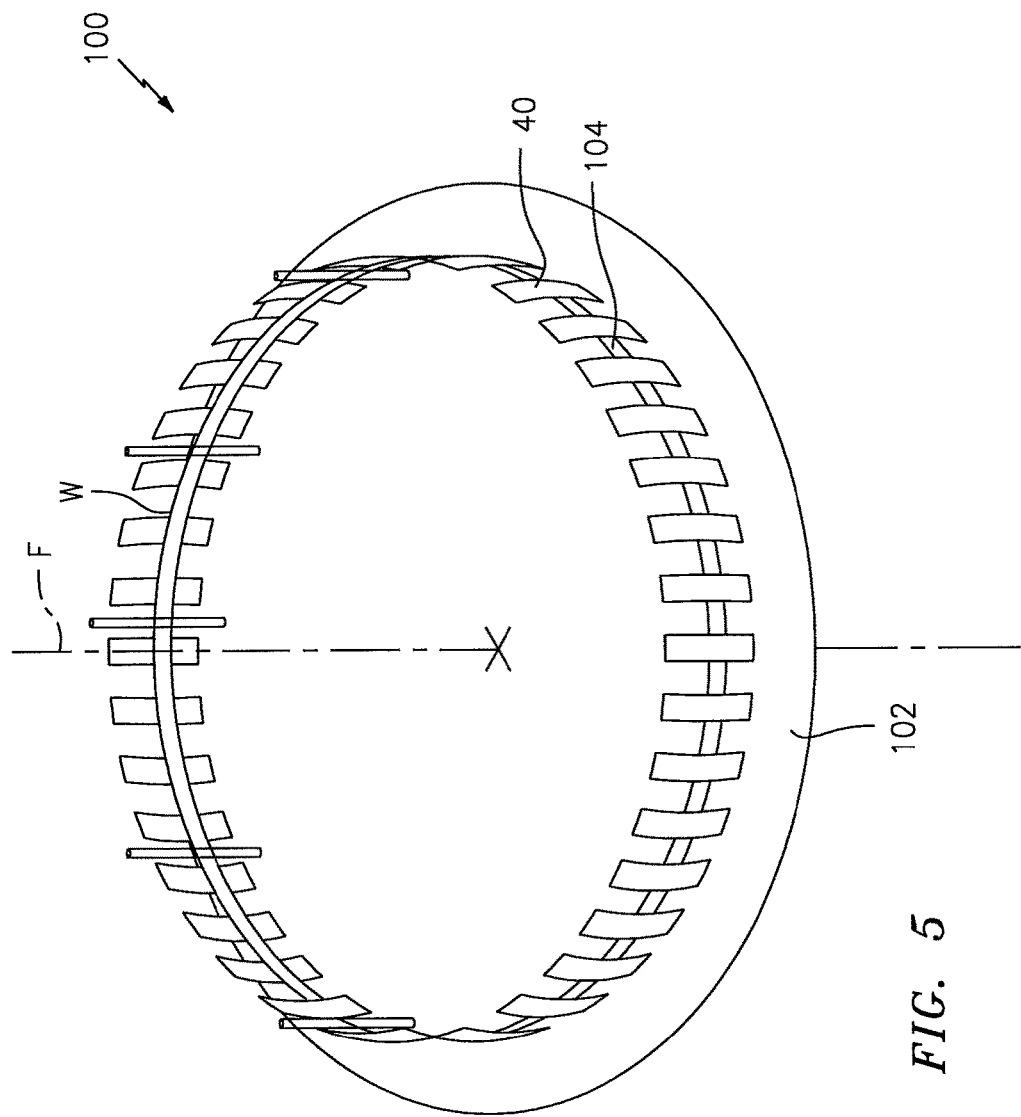
FIG. 5 is a schematic view of a fixture assembly according to one disclosed non-limiting embodiment.
Figure 6:
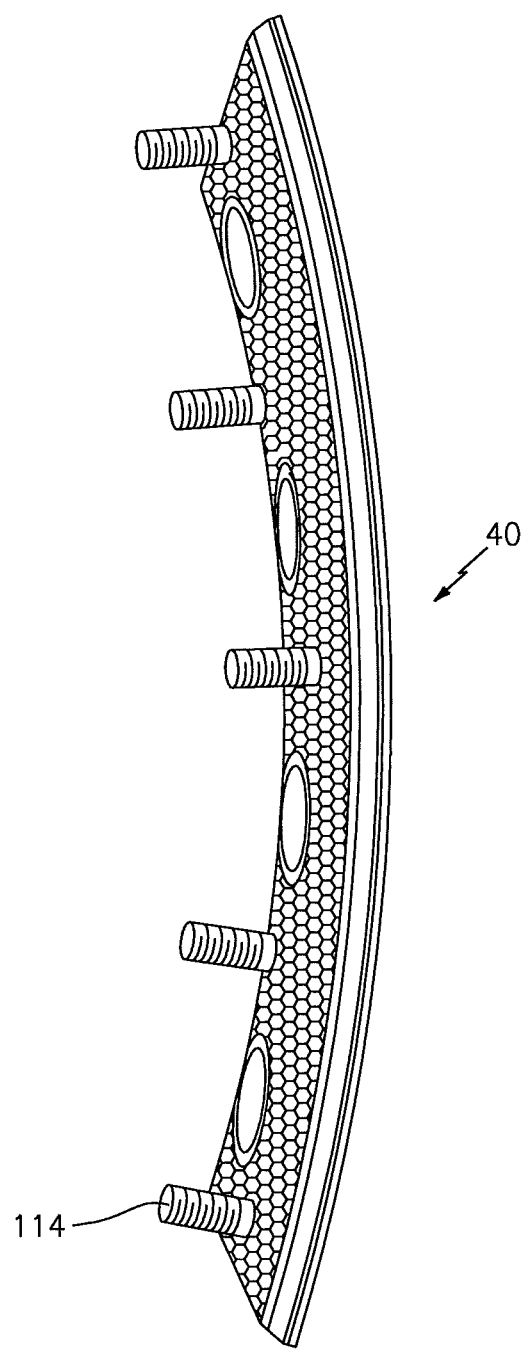
FIG. 6 is a side view of a liner panel.

With reference to FIG. 5, a fixture assembly 100 generally includes a base plate 102 and a multiple of holder assemblies 104 which extend therefrom. The multiple of holder assemblies 104 extend around and generally parallel to a central axis F of the base plate 102. Each of the multiple of holder assemblies 104 support a workpiece such as the liner panel 40 (FIGS. 6, 7 and 8) in the fixture axial direction as compared to an orientation as configured in the engine.

With reference to FIGS. 9-12, each of the multiple of holder assemblies 104 generally includes a support 106, a backplate 108 and a spray coating shield 110. It should be understood that various other architectures to receive various other workpieces will also benefit herefrom.

The support 106 supports the backplate 108 and the spray coating shield 110 on the base plate 102. In one disclosed non-limiting embodiment, each support 106 may be received in a slot or other receipt member on the base plate 102. Alternatively, the backplate 108 may be attached to the base plate 102 through one or more fixed rings W (FIG. 5) that are attached and supported on the base plate 102. That is, the mounts 108 are threaded or otherwise attached directly to the fixed rings W which themselves are supported on the base plate 102 and operate to support the mounts 108. It should be appreciated that numerous mounts may be supported on each fixed ring W.

Figure 11:
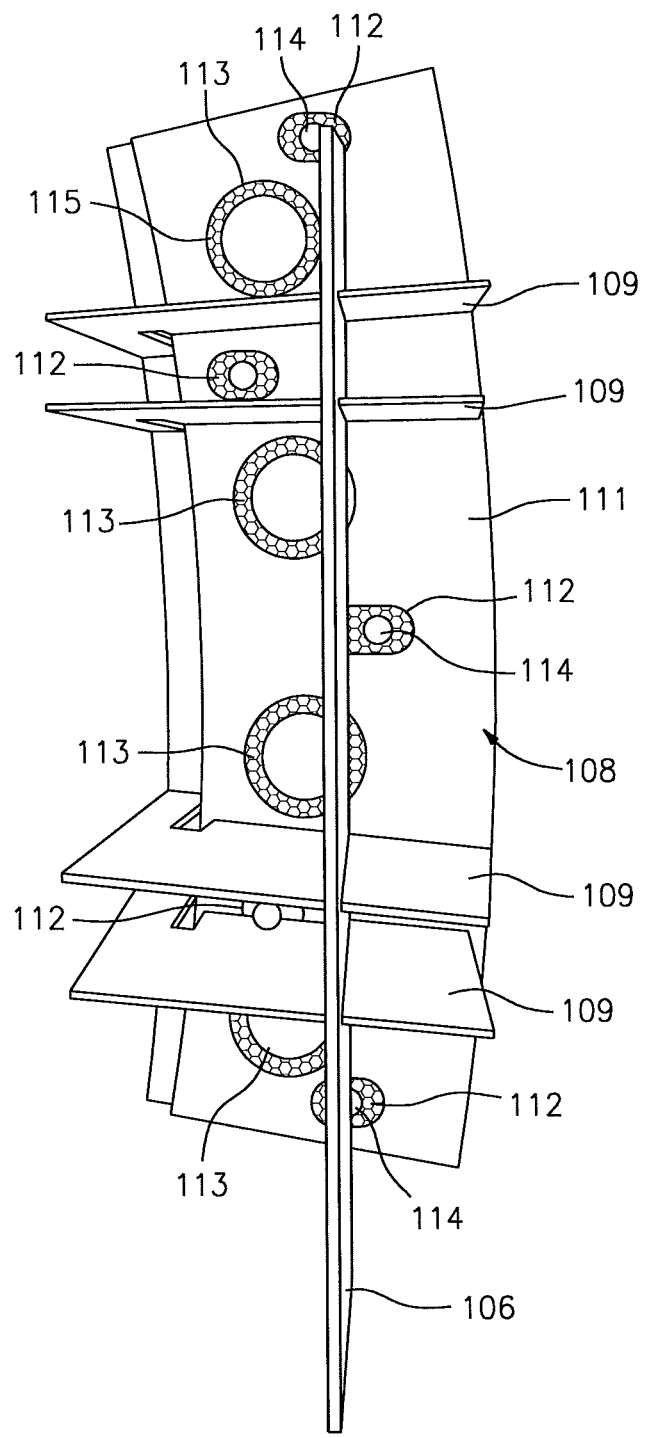
FIG. 11 is a rear view of the holder according to one disclosed non-limiting embodiment for the liner panel.
Figure 12:
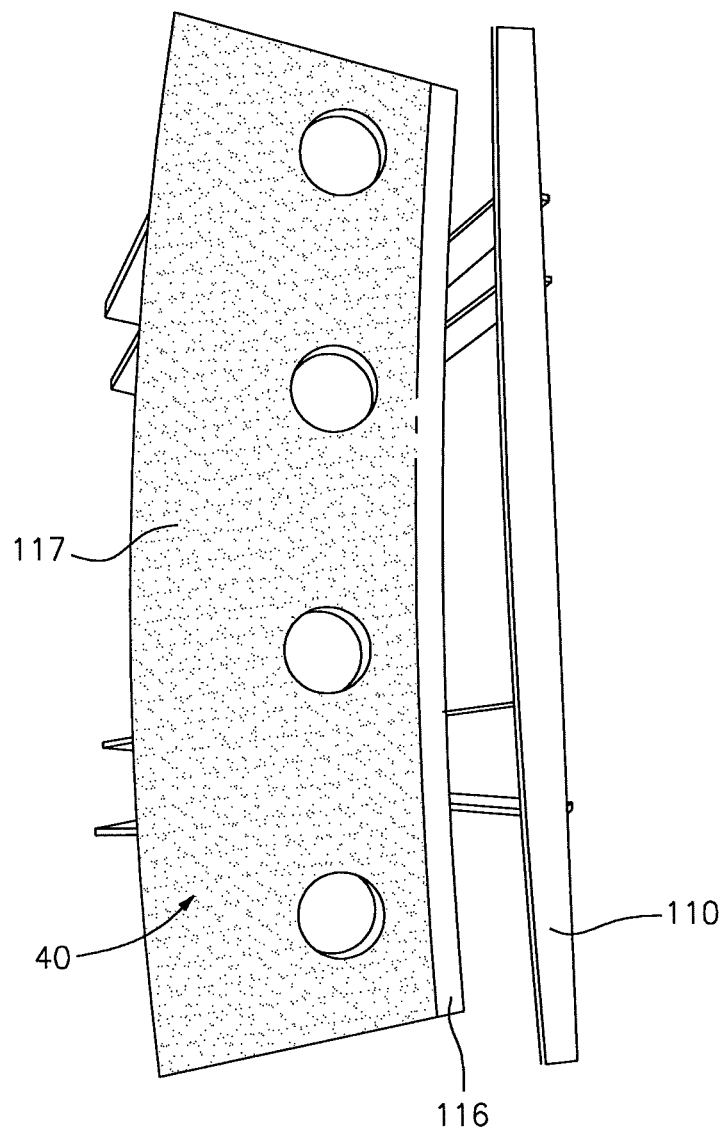
FIG. 12 is a front view of a holder according to one disclosed non-limiting embodiment for the liner panel.

The backplate 108 generally includes one or more standoffs 109 and a backplate 108 (FIG. 11). The one or more standoffs 109 are mounted to the support 106 to support the backplate 108 and the spray coating shield 110. The support 106, the one or more standoffs 109, the backplate 108 and the spray coating shield 110 may include assembly slots that facilitate tab and slot assembly with tack weld type or other retention.

With reference to FIG. 11, the backplate 108 includes a multiple of apertures 112 that correspond with the threaded studs 114 (FIGS. 7 and 8) which extend from a backside of the liner panel 40. Fasteners such as nuts may be threaded to the threaded studs 114 on the backside of the backplate 108 to retain the panel 40 thereto.

Figure 7:
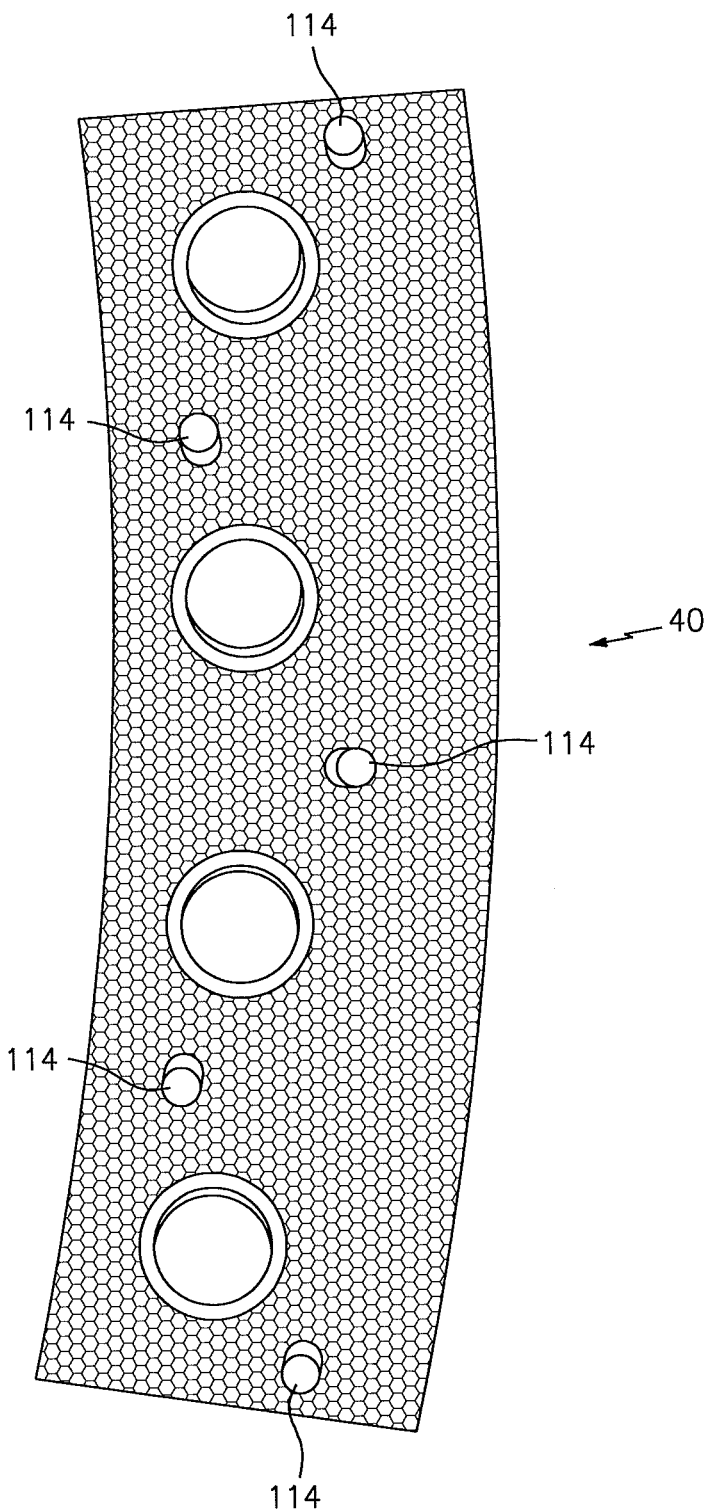
FIG. 7 is a rear view of the liner panel.
Figure 8:
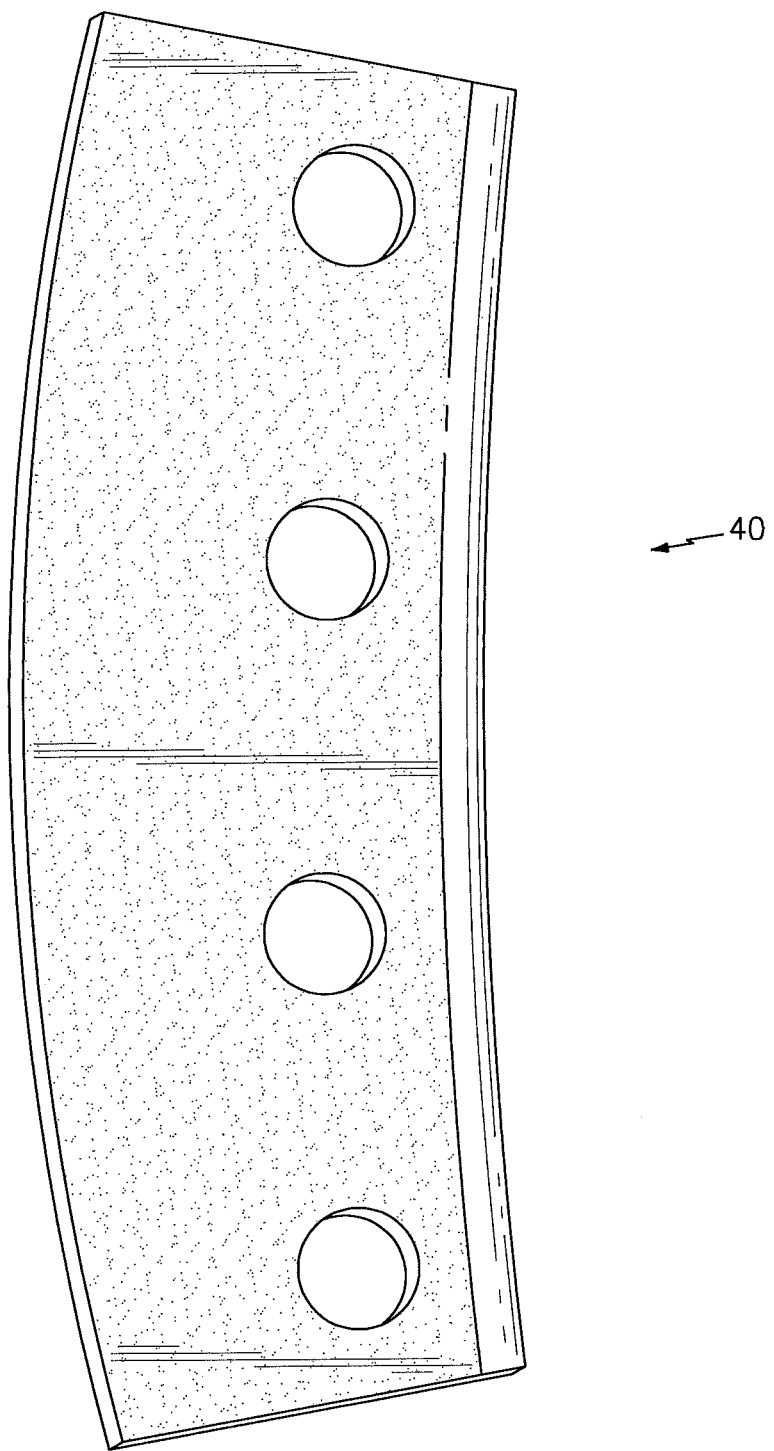
FIG. 8 is a front view of the liner panel.
Figure 9:
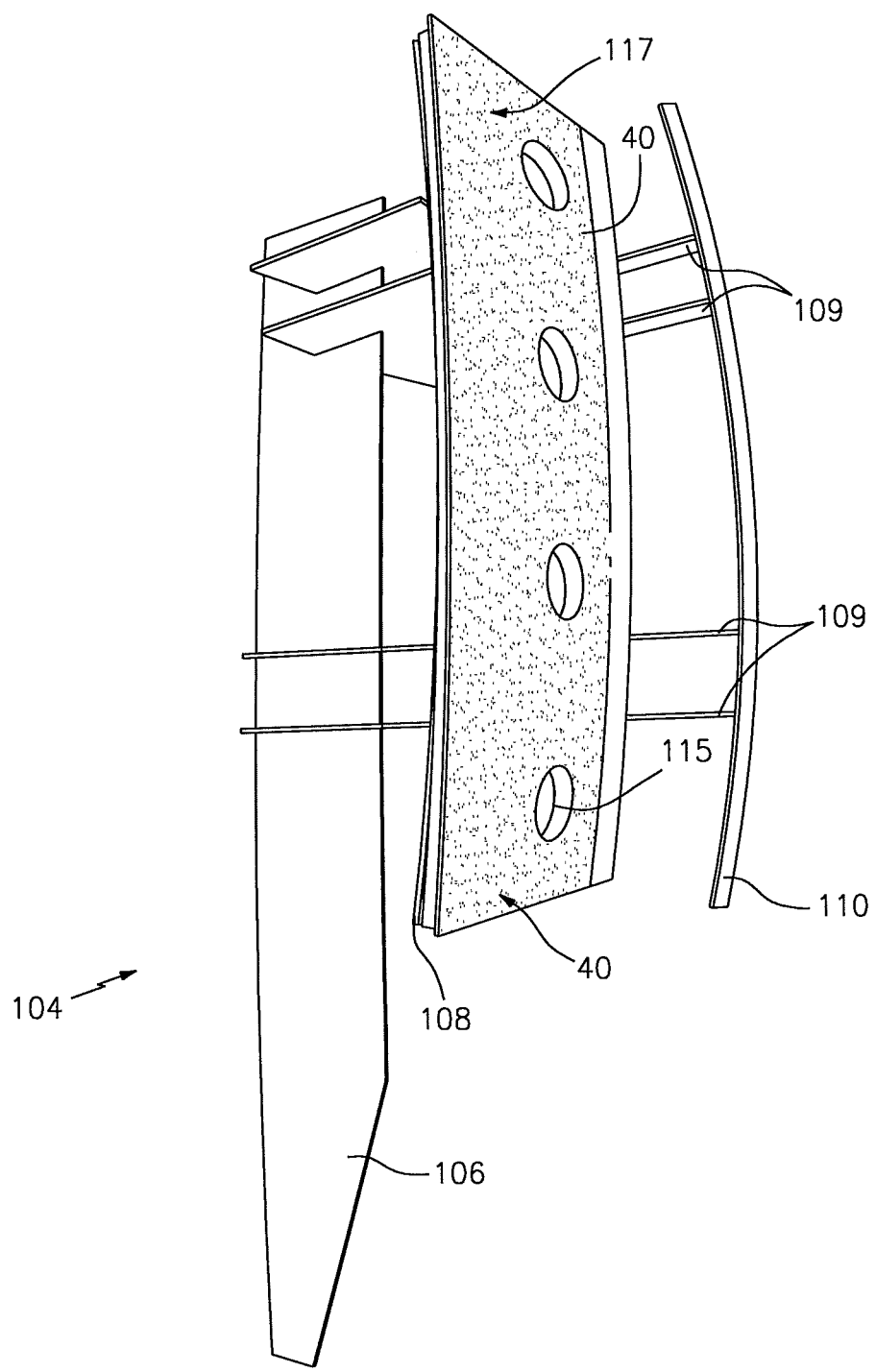
FIG. 9 is a perspective view of a holder according to one disclosed non-limiting embodiment for the liner panel.
Figure 10:
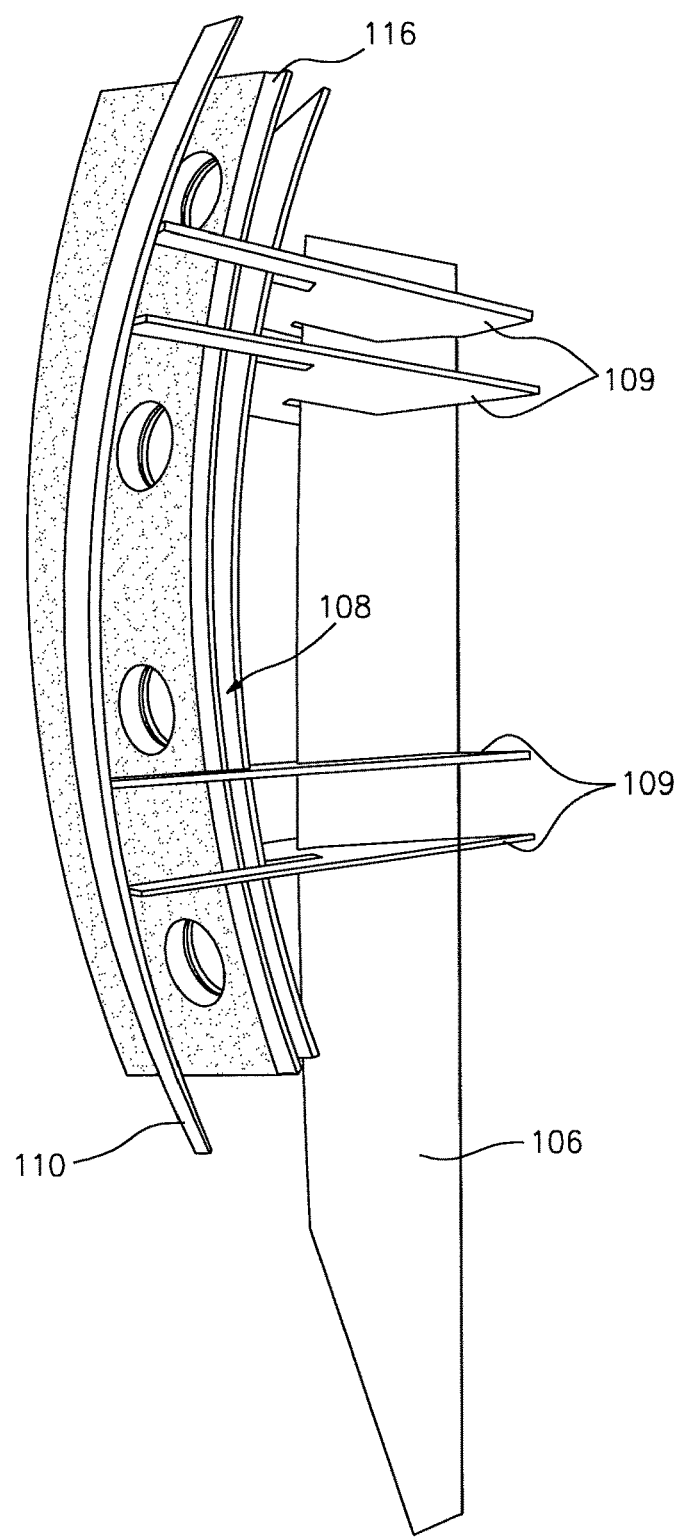
FIG. 10 is a perspective view of the holder according to one disclosed non-limiting embodiment for the liner panel.

The backplate 108 also includes a multiple of apertures 113 that correspond with a multiple of liner panel apertures 115 in the liner panel 40 (FIGS. 7 and 8). The multiple apertures 113 are aligned with the respective liner panel apertures 115 such that spray from the spray operation passes through both the liner panel 40 and the backplate 108 to prevent buildup and reflected spray onto the backside of the liner panel 40. It should be appreciated that the multiple of apertures 113 may be larger than the liner panel apertures 115.

Figure 13:
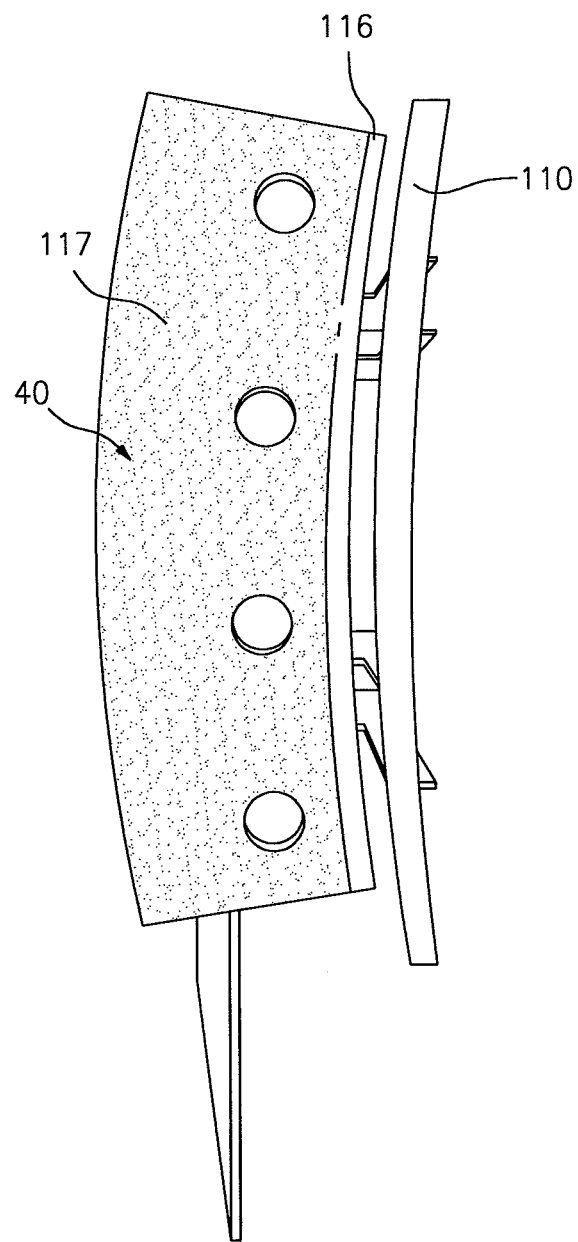
FIG. 13 is a front view of a holder according to one disclosed non-limiting embodiment for the liner panel illustrating a shadow mask.
Figure 14:
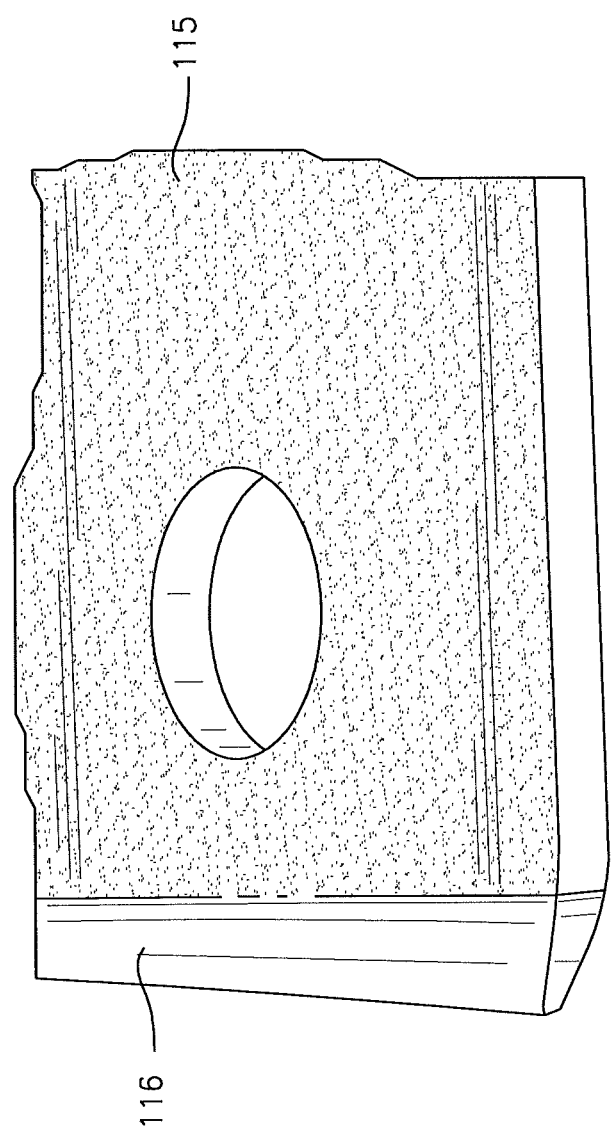
FIG. 14 is an expanded perspective view of an uncoated shadowed surface area of the liner panel.

The spray coating shield 110 is mounted to the one or more standoffs 109 and is thereby spaced away from, and extends generally parallel to, the backplate 108 so as to shadow mask (FIG. 13) a shadowed surface area 116 (FIG. 14) on a hot side 117 of the liner panel 40. That is, the spray coating shield 110 is spaced a predetermined distance from the workpiece relative to the shadowed surface area 116 thereof to mask the shadowed surface area 116 with a "shadow" therefrom.

It should be appreciated that the standoffs 109 may be removeable, and/or grouped into clusters that are afixed to the base plate 102 to, for example, prevent the standoffs 109 from being coated with bond coat, or may allow the liner panel 40 to be spaced close together.

Figure 4:
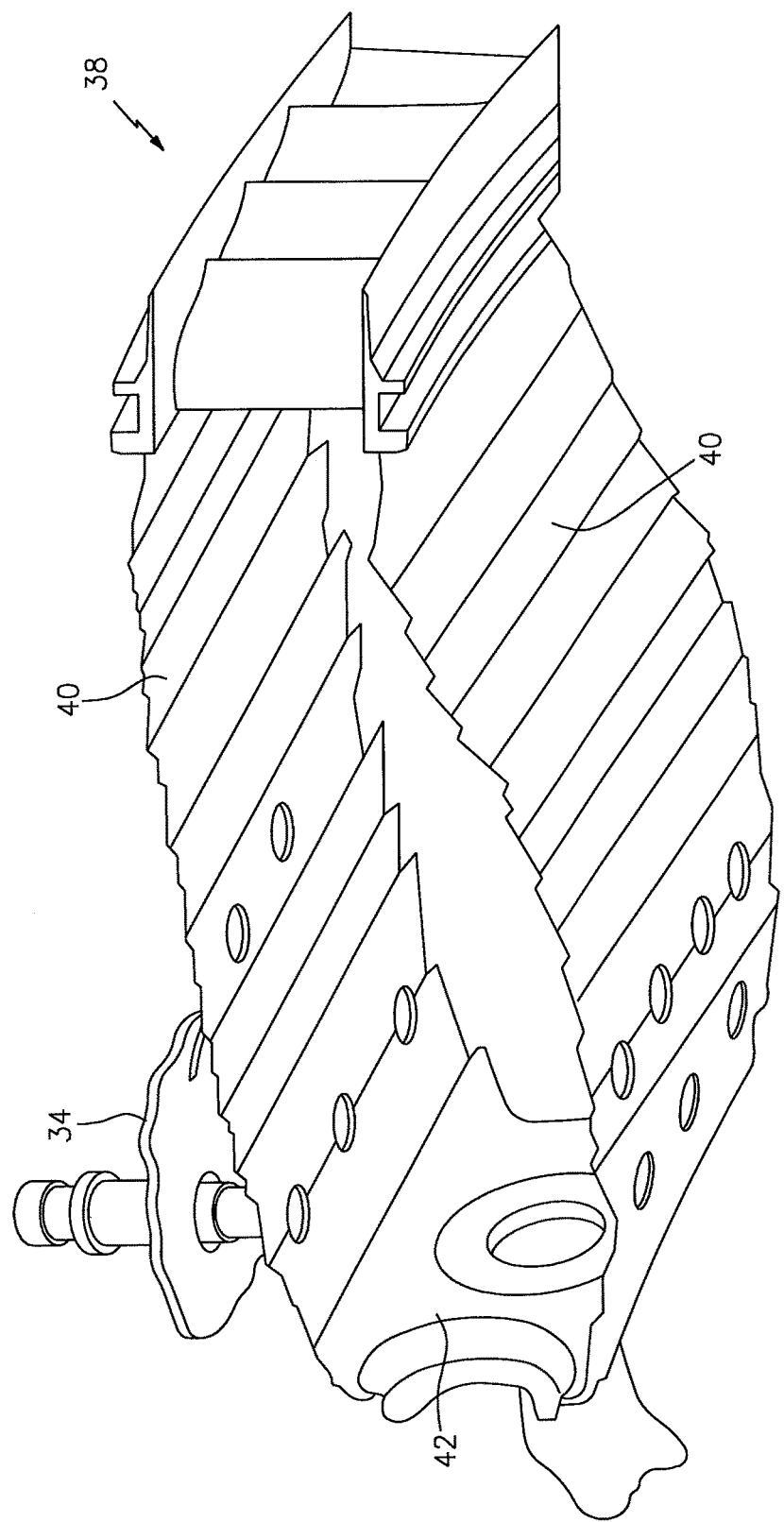
FIG. 4 is a schematic perspective view of a combustor.
Figure 15:
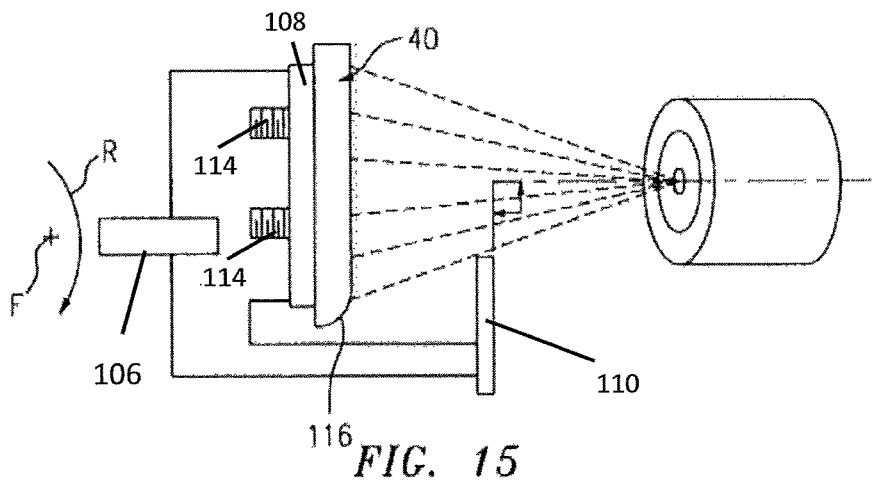
FIG. 15 is a schematic view of a bond coat spray angle with respect to the liner panel.
Figure 16:
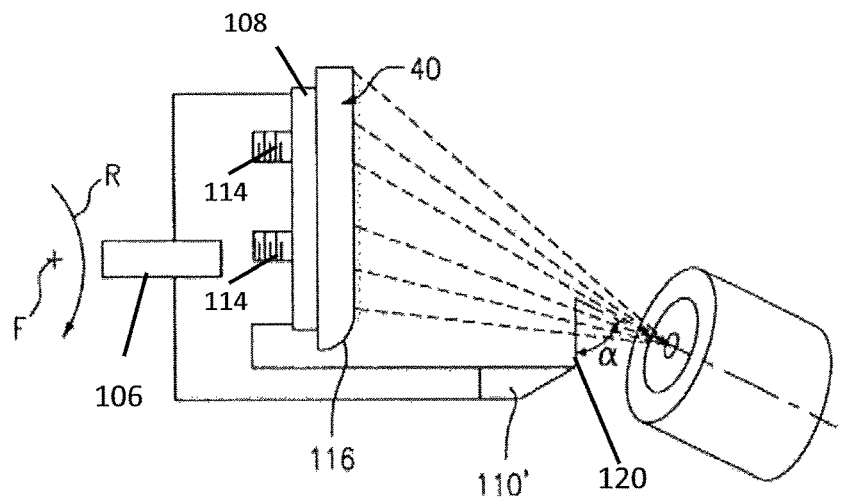
FIG. 16 is a schematic view of a bond coat spray angle with respect to the liner panel.

With reference to FIGS. 15 and 16, the base plate 102 is rotated about the axis of rotation F (illustrated schematically by arrow R) so the liner panel 40 or workpiece are sprayed with, for example, a thermal barrier coating such as an MCrAlY base coat and a 7YSZ and/or GdZrOx composition topcoats at a predefined angle with respect to the axis of rotation F. For example, a base coat is sprayed at ninety (90) degrees with respect to the liner panel 40 to coat the entirety of the liner panel 40 with the base coat. Then, a top coat is sprayed at an angle α (FIG. 16) with respect to the liner panel 40 to mask the shadowed surface area 116 with a "shadow" therefrom. Shadow masking minimizes the potential for the top coat to chip when assembled adjacent to the other liner panels 40 (FIG. 4).

With reference to FIG. 16, in another disclosed non-limiting embodiment, the spray coating shield 110' is of an extended wedge shape to mask the shadowed surface area 116 with respect to the angle α. It should be understood that various holder assemblies 104 may be mounted to the same base plate 102. This extended shadowed surface area shape 120 or knife shadowed surface area feature is self-maintaining due to the fact that coating does not adhere well with low angle impingement. Also, the exposed shadowed surface area of standoffs 109 between the liner panel 40 and standoff 109 that retain the spray coating shield 110 may also be a shadowed surface area or knife shadowed surface area shaped to be self-maintaining as well.

Figure 17:
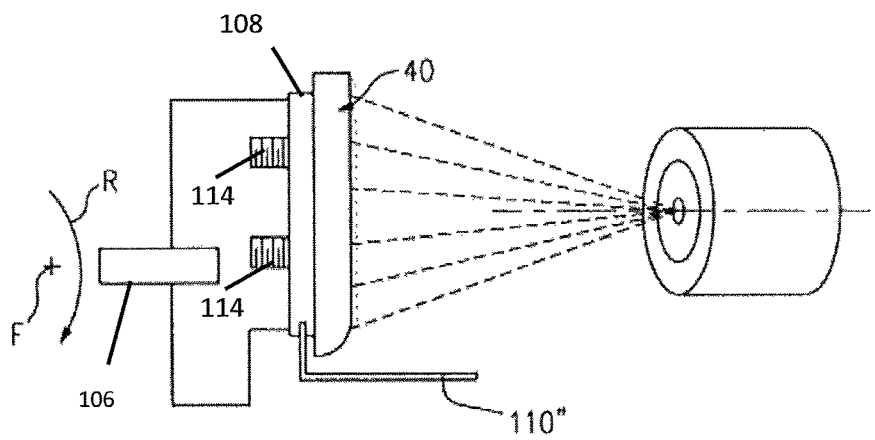
FIG. 17 is a perspective view of a holder for the liner panel illustrating a shadow mask according to another disclosed non-limiting embodiment.

With reference to FIG. 17, in another disclosed non-limiting embodiment, the spray coating shield 110" is arranged generally radially and axially relative to the backplate 108. That is, the spray coating shield may be an L-shaped member attached to the backplate 108. For example, the spray coating shield 110" may be a thin sheet metal component arranged generally perpendicular to the coated surface of the liner panel 40 to extend toward a direction to the spray so as to as to provide a shadow in the spray coating. More specifically, an example is 16-gage sheet metal spaced ⅛ inch (3.2 mm) from the shadowed surface area of the liner panel 40 to be shadow masked and perpendicular from the coated surface of the liner panel by 1 inch (25 mm).

It should be appreciated that the spray coating shield 110, 110' and 110" may be removable to further facilitate modularity. For example, the spray coating shield 110, 110' and 110" may be selectively removed or installed for particular coating operations such as removal for bond coat applications. With the disclosed arrangements, the workpieces are not oriented and configured as in the engine but are rotated so that the short part dimension, is oriented in the circumferential direction and the long dimension is in the fixture axial direction. About four times the number of liner panels 40 can thereby be fixtured to an example 25 inch (635 mm) diameter fixture yet the mask is maintained.

Powder to part deposition efficiency is increased and cycle time per part is reduced with this fixture configuration. Flexibility is also achieved to combine various workpieces in one spray event. Manual part cleaning operations are also reduced or eliminated.

There is thereby an improvement in the economics of coating as the fraction of traverse spray time on the part versus over travel is increased. Furthermore, there is no engine diameter constraint on fixture size. Because the non-curved part direction is aligned with the circumferential direction, the diameter of the fixture assembly may be readily increased to accommodate almost any number of parts desired. This further improves efficiency by reducing the number of times the spray process needs to be started and stopped.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be understood that relative positional terms such as "forward," "aft," "upper," "lower," "above," "below," and the like are with reference to the normal operational attitude of the vehicle and should not be considered otherwise limiting.

It should be understood that like reference numerals identify corresponding or similar elements throughout the several drawings. It should also be understood that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A system, comprising:
   a standoff;
   a backplate positioned relative to the standoff;
   a spray coating shield positioned relative to the standoff, the spray coating shield spaced from said backplate;
   a material source that sprays a base coat at ninety degrees with respect to a surface of a workpiece to coat the workpiece with the base coat; and the material source sprays a top coat at an angle with respect to the surface of the workpiece to mask a shadowed surface area of the workpiece, the angle different from ninety degrees,
wherein the backplate includes a multiple of first apertures that align with apertures through the workpiece such that spray from the material source passes through the workpiece and the backplate.

2. The system as recited in claim 1, wherein the backplate includes a multiple of second apertures that correspond with studs that extend from the workpiece.

3. The system as recited in claim 1, wherein the spray coating shield is wedge shaped.

4. The system as recited in claim 3, wherein the spray coating shield is spaced a predetermined distance from the workpiece to mask the shadowed surface area of the workpiece with a shadow therefrom.

5. The system as recited in claim 1, wherein the spray coating shield is removable.

6. The system as recited in claim 1, further comprising a support, the standoff supported by the support.

7. The system as recited in claim 6, wherein the support is received in a slot of a baseplate.

8. The system as recited in claim 1, wherein the spray coating shield includes a knife edge that corresponds to the shadowed surface area of the workpiece.

9. The system as recited in claim 1, wherein the workpiece is a liner panel.

10. A system, comprising:
a standoff;
a backplate positioned relative to the standoff;
a spray coating shield spaced from said backplate; and
a material source that sprays a top coat at an angle with respect to a surface of a workpiece to mask a shadowed surface area of the workpiece, the angle different from ninety degrees,
wherein the backplate includes a multiple of apertures that align with apertures through the workpiece such that spray from the material source passes through the workpiece and the backplate.

11. The system as recited in claim 10, wherein the spray coating shield includes a knife edge that corresponds to the shadowed surface area of the workpiece.

12. The system as recited in claim 10, wherein the material source sprays a base coat onto the surface of the workpiece at ninety degrees with respect to the surface of the workpiece.

13. The system as recited in claim 7, further comprising:
a holder assembly that receives a second workpiece, the holder assembly including:
a second standoff;
a second backplate; and
a second support,
wherein the second support is received in a second slot of the baseplate,
wherein the second standoff is mounted to the second support to support the second backplate, and
wherein the workpiece and the second workpiece are different types of workpieces.

14. The system as recited in claim 10, further comprising:
a first support, the standoff supported by the first support; and
a holder assembly that receives a second workpiece, the holder assembly including:
a second standoff;
a second backplate; and
a second support,
wherein the first support is received in a first slot of a baseplate,
wherein the second support is received in a second slot of the baseplate,
wherein the second standoff is mounted to the second support to support the second backplate, and
wherein the workpiece and the second workpiece are different types of workpieces.

15. The system as recited in claim 6, wherein the standoff includes a notch that receives the support.

16. The system as recited in claim 14, wherein the standoff includes a notch that receives the first support.

* * * * *